(12) United States Patent
Sengers et al.

(10) Patent No.: US 7,619,747 B2
(45) Date of Patent: Nov. 17, 2009

(54) LITHOGRAPHIC APPARATUS, ANALYZER PLATE, SUBASSEMBLY, METHOD OF MEASURING A PARAMETER OF A PROJECTION SYSTEM AND PATTERNING DEVICE

(75) Inventors: Timotheus Franciscus Sengers, 's-Hertogenbosch (NL); Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 621 days.

(21) Appl. No.: 11/014,236

(22) Filed: Dec. 17, 2004

(65) Prior Publication Data

US 2006/0132775 A1 Jun. 22, 2006

(51) Int. Cl.
*G01B 11/02* (2006.01)
(52) U.S. Cl. ...................... 356/515; 356/364
(58) Field of Classification Search ............. 355/68, 355/55, 53; 359/483, 485, 489, 494, 495, 359/501; 356/364, 366, 367, 370, 515
See application file for complete search history.

(56) References Cited

U.S. PATENT DOCUMENTS

| | | | |
|---|---|---|---|
| 5,631,731 A | 5/1997 | Sogard | |
| 5,673,103 A | 9/1997 | Inoue et al. | |
| 5,689,480 A * | 11/1997 | Kino | 369/14 |
| 5,841,520 A * | 11/1998 | Taniguchi | 355/53 |
| 7,277,182 B2 * | 10/2007 | Wegmann et al. | 356/494 |
| 7,286,245 B2 * | 10/2007 | Wegmann et al. | 356/521 |
| 2002/0070355 A1 * | 6/2002 | Ota | 250/492.2 |
| 2002/0197541 A1 | 12/2002 | Grobman et al. | |
| 2003/0227669 A1 | 12/2003 | Volke et al. | |
| 2004/0048469 A1 | 3/2004 | Wu et al. | |
| 2004/0114150 A1 | 6/2004 | Wegmann et al. | |
| 2004/0137338 A1 * | 7/2004 | Inao et al. | 430/5 |
| 2005/0007573 A1 * | 1/2005 | Hansen et al. | 355/71 |
| 2005/0105180 A1 | 5/2005 | Mackey | |
| 2005/0146693 A1 * | 7/2005 | Ohsaki | 355/30 |
| 2005/1020687 * | 9/2005 | Van Dijk et al. | 356/121 |

FOREIGN PATENT DOCUMENTS

| | | |
|---|---|---|
| EP | 1 124 163 A2 | 8/2001 |
| EP | 1 467 253 A1 | 10/2004 |
| JP | 6-124872 | 5/1994 |
| JP | 7-174517 | 7/1995 |
| JP | 9-504861 A | 5/1997 |
| JP | 2003-121385 | 4/2003 |
| JP | 2004-0317137 A | 2/2004 |
| JP | 2004-348050 | 12/2004 |
| JP | 2005-116733 | 4/2005 |

OTHER PUBLICATIONS

European Search Report issued in EP Application No. 05 11 1692 dated Jan. 15, 2007.

* cited by examiner

*Primary Examiner*—Tarifur Chowdhury
*Assistant Examiner*—Jonathan M Hansen
(74) *Attorney, Agent, or Firm*—Pillsbury Winthrop Shaw Pittman LLP

(57) ABSTRACT

An analyzer plate positioned between a projection system and a radiation sensor is illuminated by a projected beam of radiation. The analyzer plate includes two crossing regions, each of which transmits radiation with a different polarization direction. The beam of projection radiation is patterned without influencing the polarization of the beam. By patterning the beam of projection radiation so that one region receives more radiation than the other region, the radiation sensor is given polarization selectivity.

31 Claims, 9 Drawing Sheets

LITHOGRAPHIC APPARATUS, ANALYZER PLATE, SUBASSEMBLY, METHOD OF MEASURING A PARAMETER OF A PROJECTION SYSTEM AND PATTERNING DEVICE

FIELD

The present invention relates to lithographic apparatus and methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

The dimensions of the circuit patterns on the target portions may be very small. In order to use a patterning device on which the circuit patterns have larger dimensions, a projection system is used. This projection system reduces all circuit dimensions with the same factor. The projection system consists of several lenses or mirrors.

During engineering, the projection system is optimized as far as possible. However projection systems may be very difficult to produce and may contain manufacturing errors to a certain extent. For example, the powers of lenses may vary due to manufacturing tolerances, and the positions of the lenses in the projection system may also vary due to the manufacturing tolerances. Both of these variations may cause aberrations of the projection system, or change the power of the system to a non-optimal value.

Additionally, the projection system is optimized for a specified wavelength of projection beam radiation. However, in practice the wavelength of the beam of radiation passing through the projection system may vary, and because of dispersion within the lens elements, this may change the power of the projection system to a non-optimal value.

Finally the material of the lenses may decay because of the highly intense radiation of the projection beam that passes through them, modifying the transmission characteristics of the lenses.

Generally, the position of at least one lens element of the projection system is controlled by a mechanism which controls the system so that aberrations are minimized and magnification errors are corrected. The control mechanism works by adjusting positions of the lenses. However, in some cases, the settings of the control mechanism may drift over time, with the effect that lenses are wrongly moved to non-optimal positions.

The production of projection systems with mirrors may be subject to comparable difficulties.

In U.S. Pat. No. 5,631,731, the performance of the projection system is analyzed by patterning the beam of radiation with a test pattern and gathering position dependent information on the image of the test pattern. This image is formed in the focal plane of the projection system. The information is gathered by moving a slit through this image and measuring the amount of radiation that passes the slit. The slit is chosen with a small width to provide the highest resolution possible. A high resolution is necessary since the image is determined by the convolution of the test pattern and the performance of the projection system. The wider the slit, the lower the resolution, and the less accurate the performance can be calculated since the information will be smeared out. To gather information on projection systems operating close to the diffraction limits, the slit is chosen to have a width smaller than the wavelength of the projection beam radiation.

The radiation transmitted through the moving slit is measured by a photo detector, either directly or after the wavelength has been converted to a wavelength convenient for the photo detector. The output of the photo detector, combined with information regarding the position at which the measurement is obtained, gives a high resolution energy profile of the generated image. Energy profiles for slits with different directions are obtained for analysing performance of the projection system imaging lines with different directions. A deconvolution is applied on the profiles using a profile derived from a theoretical, perfect image of the reticle formed by a perfect lithographic apparatus, which perfect image is stored in software, to find the performance of the projection system.

The measurements may suffer from a dependency on the polarization state of the beam of radiation because the transmissions through the slits are polarization dependent. If polarization dependency causes a lower energy to be measured with the slit in a first direction than the energy measured with the slit in a second direction, this may be erroneously interpreted as a difference in projection system performance. U.S. Pat. No. 5,631,731 describes how measurement errors for different polarization states are suppressed by designing the slits so that the transmitted radiation is equal for the transmitted polarization directions, or by sequentially scanning two slits which transmit radiation with different polarization directions through the same test pattern image. Since the transmission of the two slits for their respective polarization directions may not be equal, a model is used to calculate the transmissions for the two slits. Both the transmissions and measured intensities are used to compensate for polarization effects. However, imperfections in the model lead to errors in the compensation for polarization effects.

In the event that energy ranges in the energy profiles for the first slit and the second slit differ significantly, the signal to noise ratio of the photo detector introduces additional measurement errors. These significant differences arise for instance when polarized radiation is present in the image.

To analyze polarization effects, the slit plate needs to contain slits with different orientations. The slits and their corresponding test patterns are positioned so that only the slit, or slits, of a given orientation are illuminated at a given time. To allow this to be done, the slits with different orientations are spatially separated (i.e. in different domains). Separate detectors can be used to measure the slits in the different domains. However, using a set of two detectors for two slits in different domains, will cause measurement errors because of the different behaviour of the detectors, such as sensitivity and signal to noise ratio.

If one detector is used instead of two detectors, there may be other disadvantages. The detector may be arranged to be capable of measuring the radiation from both spatially separated slits in the slit plate on different spatially separated domains of the detector. However, the spatially separated domains on the detector should respond equally to radiation falling onto them. It may be difficult and expensive to produce such a detector.

A further disadvantage is that the detector (or set of two detectors) and corresponding slit plates are large and therefore heavy. This is a disadvantage because the detector and slit plate are placed on the x-y-z positioning stage and space is scarce on the x-y-z positioning stage. Also, weight is unwanted on the x-y-z positioning stage in order to reduce the size of necessary drives and their power consumption and heat dissipation at height accelerations of the x-y-z positioning stage.

Instead of placing the photo detector under the slit plate, the radiation from the two slits may be collected by a light pipe (e.g. an optical fiber) so that only one domain on the detector is used for the radiation from the two slits with different orientations. In the light pipe, the collected radiation of the first slit propagates until a point where radiation collected from the second slit propagates. From this point to the detector, the propagation of radiation from the first slit and the second slit follows equal optical paths. Until this point, the optical paths are different.

Differences in losses during propagation in the different optical paths, may lead to measurement errors. A further disadvantage is that adding a light pipe to x-y-z positioning stage next to the slit plate and the detector, adds weight and will use space, and, as mentioned above, space is scarce on the x-y-z positioning stage. Also, weight is unwanted on the x-y-z positioning stage in order to reduce the size of necessary drives and their power consumption and heat dissipation at height accelerations of the x-y-z positioning stage.

SUMMARY

Embodiments of the present invention include a lithographic apparatus with alternative or improved capabilities to measure the polarization of radiation projected by the projection system.

In an embodiment of the invention, there is provided a lithographic apparatus arranged to project a beam of radiation with a pattern from a patterning device in its cross section using a projection system, the lithographic apparatus including an analyzer plate having a first region arranged to preferentially let through radiation polarized in a first direction and a second region arranged to preferentially let through radiation polarized in a second direction, and the lithographic apparatus including a radiation sensor arranged to measure radiation let through the first and second regions of the analyzer plate; the lithographic apparatus being capable of selecting the area of the first region and the area of the second region illuminated by the pattern during a measurement by the radiation sensor, wherein the second region crosses the first region.

The lithographic apparatus according to the invention provides an alternative determination or improved determination of the polarization of the projection system. This is achieved by the combination of the analyzer plate, having two regions that preferentially let through radiation polarized in two directions, and the pattern preferentially illuminating one of the two regions. As a result, radiation preferentially polarized in one direction is let through the analyzer plate and measured by the radiation sensor. The analyzer plate can remain relatively small and light-weight and one domain of one radiation sensor is used giving accurate results, but still the lithographic apparatus can measure radiation preferentially polarized in the first or second direction.

According to an embodiment of the invention, there is provided a lithographic apparatus wherein the patterning device includes a region arranged to let the beam of radiation through, the transmission of the beam of radiation through the patterning device being independent of the polarization direction of the beam of radiation.

A benefit of the lithographic apparatus according to this embodiment is that the measurements can be compared directly to the polarization status of the beam of radiation without a pattern in its cross section. In practice, the polarization status of the beam of radiation before it reaches the patterning device is known.

According to an embodiment of the invention, there is provided a lithographic apparatus wherein the first direction and the second direction are substantially perpendicular.

A benefit of the lithographic apparatus according to this embodiment of the invention is, that calculations to give the polarization in orthogonal directions are avoided.

According to an embodiment of the invention, there is provided a lithographic apparatus, wherein the first region and the second region on the analyzer plate are substantially perpendicular lines.

A benefit of the lithographic apparatus according to this embodiment of the invention is that substantially perpendicular lines avoid the need for computation to split up the contributions of radiation polarized in the perpendicular directions.

According to an embodiment of the invention, there is provided a lithographic apparatus, wherein the analyzer plate has additional regions arranged to preferentially let through radiation polarized in the first direction and to form a grating in combination with the first region.

A benefit of the lithographic apparatus according to this embodiment of the invention is, that additional regions on the analyzer plate let through additional radiation to the radiation sensor, so that a high signal to noise ratio can be achieved for the measurements with the radiation sensor.

According to this embodiment of the invention, there is provided a lithographic apparatus, wherein the analyzer plate (AP) has further regions arranged to preferentially let through radiation polarized in the second direction and to form a grating in combination with the second region (LNY,RNY), wherein the additional regions and the further regions cross each other.

A benefit of the lithographic apparatus according to this embodiment of the invention is that further regions on the analyzer plate let through further radiation to the radiation sensor, so that a high signal to noise ratio can be achieved for the measurements polarized in the first direction with the radiation sensor and for measurements polarized in the second direction. Since the further region and the additional regions cross, the analyzer plate can remain small and light weight. One domain of one radiation sensor is used for measurements using the further regions and the additional regions giving accurate results, but still the lithographic apparatus can measure radiation preferentially polarized in the first or second direction.

According to an embodiment of the invention, there is provided a lithographic apparatus, wherein the patterning device is arranged to pattern the beam of radiation with a circuit pattern and with a pattern arranged to select the area of the first region and the area of the second region.

A benefit of the lithographic apparatus according to this embodiment of the invention is that the radiation sensor can measure without having to change the patterning device, thereby saving production output.

According to an embodiment of the invention, there is provided a lithographic apparatus, wherein the lithographic apparatus is arranged to perform in-line measurements with the radiation sensor.

A benefit of the lithographic apparatus according to this embodiment of the invention is that when the radiation sensor can perform measurements at the same time as the illumination of the circuit pattern on the substrate, the measurements have minimal impact on production output.

According to an embodiment of the invention, there is provided a lithographic apparatus, wherein a reference sensor is arranged to calibrate the measurement by the radiation sensor.

A benefit of the lithographic apparatus according to this embodiment of the invention is that the reference sensor can be used to give more accurate measurements or that absolute polarization measurements can be obtained.

According to another embodiment of the invention, there is provided an analyzer plate having a first region arranged to preferentially let through radiation polarized in a first direction and a second region arranged to preferentially let through radiation polarized in a second direction, wherein the second region crosses the first region.

The analyzer plate according to the invention has the advantage that it can be used to let through radiation preferentially polarized in one direction when selectively illuminated. The radiation preferentially polarized in one direction can be measured by a radiation sensor. The analyzer plate can remain relatively small and light-weight and one domain of one radiation sensor is used giving accurate results, but still the lithographic apparatus can measure radiation preferentially polarized in the first or second direction.

According to a further embodiment of the invention, there is provided a subassembly including an analyzer plate having a first region arranged to preferentially let through radiation polarized in a first direction and a second region arranged to preferentially let through radiation polarized in a second direction, the subassembly including a radiation sensor arranged to receive radiation passing through the analyzer plate wherein the second region crosses the first region. The subassembly according to the invention has the advantage that it can be used to measure radiation preferentially polarized in one direction when selectively illuminated. In use, the analyzer plate in the subassembly lets through radiation preferentially polarized in one direction when selectively illuminated. The radiation preferentially polarized in one direction is measured by a radiation sensor. The analyzer plate can remain relatively small and light-weight and one domain of one radiation sensor is used giving accurate results, but still the lithographic apparatus can measure radiation preferentially polarized in the first or second direction.

According to a further other embodiment of the invention, there is provided a method of measuring a parameter of a projection system using a radiation sensor, wherein the parameter differs when used for different polarization directions of a beam of radiation travelling through the projection system, the method including providing a beam of radiation, patterning the beam of radiation with a pattern in its cross section, wherein the patterning does not influence the polarization state of the beam of radiation, projecting the patterned beam of radiation onto an analyzer plate using the projection system, the analyzer plate having a first region arranged to preferentially let through radiation polarized in a first direction and a second region arranged to preferentially let through radiation polarized in a second direction, the second region crossing the first region, the pattern being such that it is preferentially projected onto the first region, measuring the amount of radiation passing through the analyzer plate (AP) to give a measurement value preferentially determined by radiation polarised in the first direction.

A benefit of this method is that a parameter of the projection system (such as transmittance for a polarization direction) can be determined with a small and light-weight analyzer plate, while using one domain on a radiation sensor giving accurate results.

According to an embodiment of the invention, the beam of radiation having a given polarization state, there is provided a method further including comparing the measurement with a previously known value to indicate the polarization state of the beam of radiation projected onto the analyzer plate.

A benefit of this method is that changes in the projection system between two measurements can be measured.

According to an embodiment of the invention, there is provided a method further including adjusting an illumination system arranged to provide the projection beam of radiation, for measuring a performance of different cross sections of the projection system using the analyzer plate and the radiation sensor.

A benefit of this method is that the performance of different cross sections of the projection system can be analyzed.

According to an additional embodiment of the invention, there is provided a patterning device including a first region arranged to let through substantially the same amount of radiation polarized in any two given directions and a second region arranged to let through the same amount of radiation polarized in any two given directions, wherein the first region crosses the second region.

A benefit of the patterning device according to the invention is that the area on the patterning device used by the first and the second region is minimal.

According to an additional embodiment of the invention, there is provided a patterning device including a circuit pattern and a region letting through the same amount of radiation for radiation polarized in any two given directions.

A benefit of the patterning device according to the invention is that the patterning device can be used for illuminating a target area on a substrate with a circuit pattern and for measuring radiation using the region.

In an embodiment of the invention, there is provided a lithographic apparatus including a projection system configured to project a patterned beam of radiation onto a target portion of a substrate; an analyzer plate including a first region arranged to transmit radiation polarized in a first direction, and a second region arranged to transmit radiation polarized in a second direction, and a radiation sensor configured to measure radiation transmitted by the first and second regions of the analyzer plate, wherein the lithographic apparatus is configured to select an area of the first region and an area of the second region illuminated by the patterned beam of radiation during a measurement by the radiation sensor, and wherein the second region crosses the first region.

In another embodiment of the invention, there is provided a method of measuring a parameter of a projection system, wherein the parameter differs in value with a change of polarization state of a beam of radiation that propagates through the projection system, the method including: patterning the beam of radiation with a pattern in its cross section to form a patterned beam of radiation; projecting the patterned beam of radiation onto an analyzer plate, the analyzer plate including a first region arranged to transmit radiation polarized in a first direction, and a second region arranged to transmit radiation polarized in a second direction, the second region crossing the first region, the patterned beam of radiation being substantially projected onto the first region of the analyzer plate, and measuring an amount of radiation passing through the analyzer plate using a radiation sensor.

In yet another embodiment of the invention, there is provided a patterning device including a first region arranged to substantially transmit a same amount of radiation polarized in any two given directions, and a second region arranged to substantially transmit a same amount of radiation polarized in these any two given directions, wherein the first region and the second region cross each other.

In another embodiment of the invention, there is provided a method of measuring a polarization state of a beam of radiation in a lithographic apparatus, the method including selecting an area of one of a first and a second region of an analyzer plate to be exposed by the beam of radiation, the first region being arranged to transmit radiation polarized in a first direction and the second region being arranged to transmit radiation polarized in a second direction, wherein the first and second regions cross each other; substantially projecting the beam of radiation onto the area of the selected region of the analyzer plate, and measuring an amount of radiation transmitted through the area of the selected region.

In the following description the additional regions may be termed as a third or a fourth region. A third region may correspond, for example, to an additional region that is arranged to substantially transmit radiation in the first direction. The third region may form a grating in combination with the first region. The fourth region may correspond, for example, to an additional region that is arranged to substantially transmit radiation in a second direction. The fourth region may form a grating in combination with the second region.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
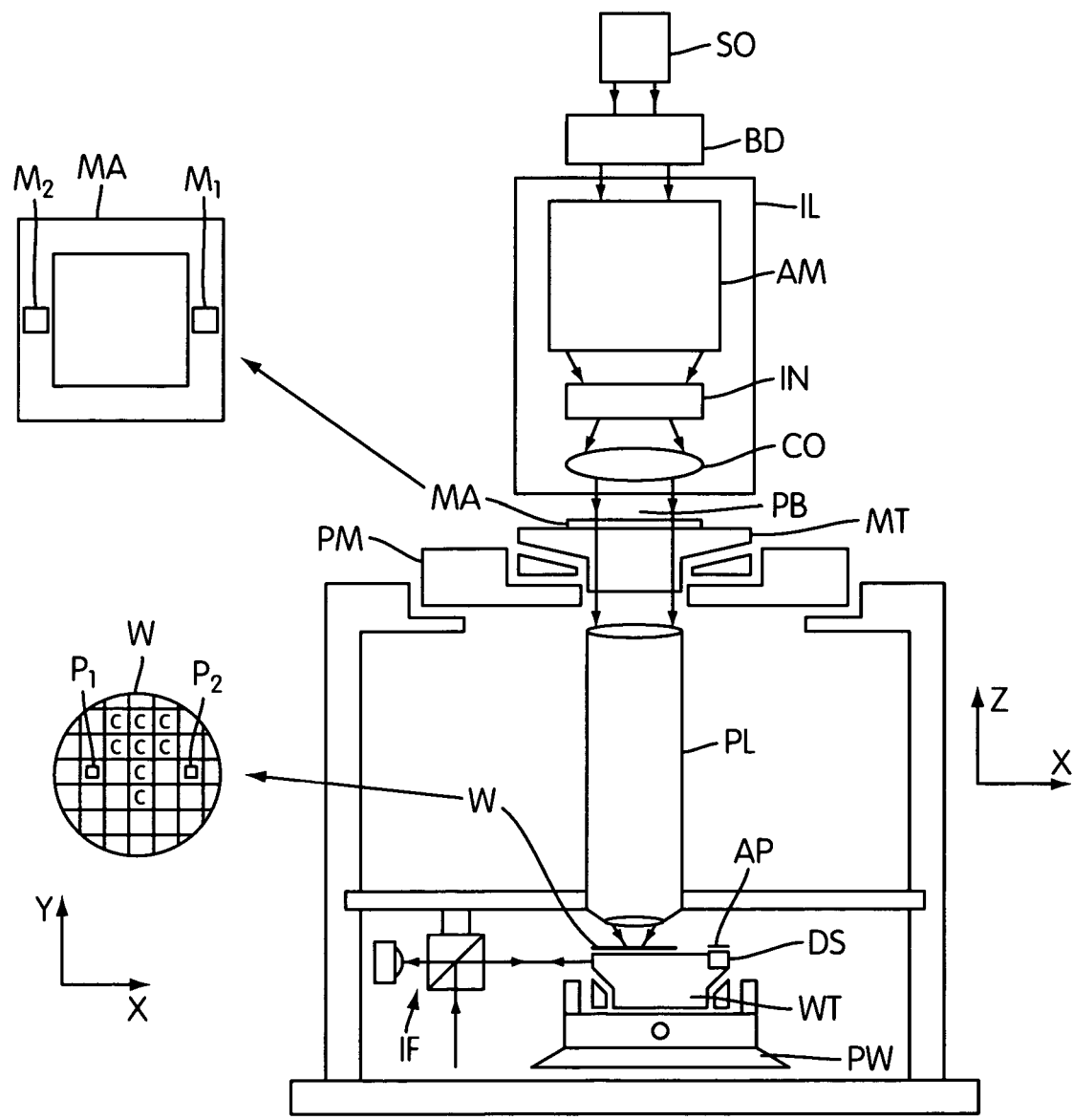
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation or DUV radiation) and a first support structure (e.g. a mask table) MT configured to support a patterning device (e.g. a mask) MA and connected to a first positioner PM configured to accurately position the patterning device with respect to the projection lens ("lens"), item PL. The apparatus also includes a substrate table (e.g. a wafer table) WT constructed to hold a substrate (e.g. a resist-coated wafer) W and connected to second positioner PW configured to accurately position the substrate in accordance with certain parameters; and a projection system (e.g. a refractive projection lens system) PL configured to project a pattern imparted to the beam PB of radiation by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases, the source may be integral part of the apparatus, for example when the source is a mercury lamp. The source SO and the illuminator IL, together with the beam delivery system BD if required, may be referred to as a radiation system.

The illuminator IL may include an adjusting device AM for adjusting the angular energy distribution of the beam. Generally, at least the outer and/or inner radial extent (commonly referred to as σ-outer and σ-inner, respectively) of the energy distribution in a pupil plane of the illuminator can be adjusted. In addition, the illuminator IL generally includes various other components, such as an integrator IN and a condenser CO. The illuminator provides a conditioned beam of radiation, referred to as the beam PB, of radiation having a desired uniformity and energy distribution in its cross-section.

The beam PB of radiation is incident on the mask MA, which is held on the mask table MT. Having traversed the mask MA, the beam PB of radiation passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

Step mode: the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The lithographic apparatus is represented in FIG. 1 with a rectangular co-ordinate system. In the co-ordinate system z is defined as being parallel to the optical axis of the projection system PL. The x and y co-ordinates are perpendicular to the optical axis of the projection system.

A radiation sensor DS is placed in the substrate table WT as shown in FIG. 1. The radiation sensor DS converts incident radiation to an electrical signal. In this example the radiation sensor DS is a photocell. An analyzer plate AP is mounted on the substrate table WT between the radiation sensor DS and the projection system PL so that only radiation that is let through, or transmitted by, the analyzer plate AP can fall on the radiation sensor DS. In use, the substrate table WT is moveable such that the radiation sensor DS and analyzer plate AP can be positioned beneath the projection system PL. The projected beam PB of radiation is then incident upon the analyzer plate AP and passes through it to the radiation sensor DS.

Figure 2:
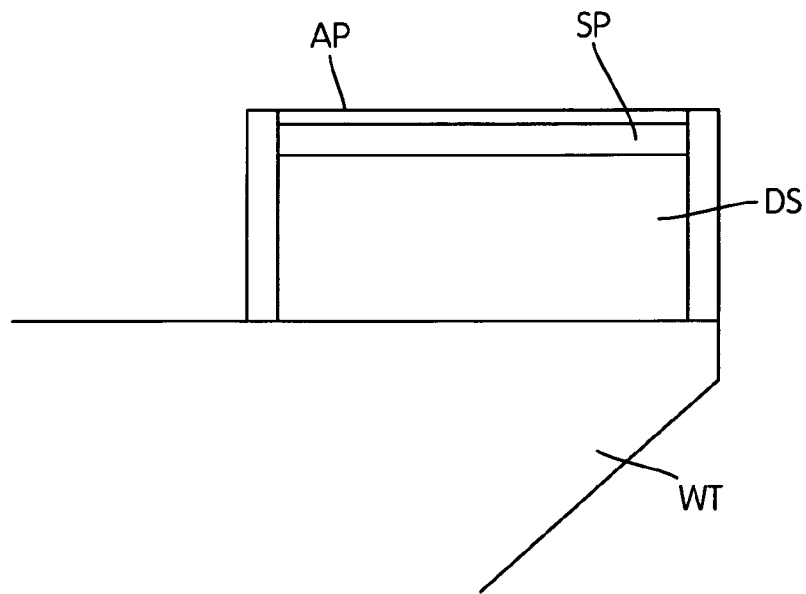
FIG. 2 depicts an analyzer plate and a radiation sensor On a substrate table.

The analyzer plate AP and the radiation sensor DS are shown in more detail in FIG. 2. Between the analyzer plate AP and the radiation sensor DS there is a space SP. This space SP may be a vacuum.

Figure 3:
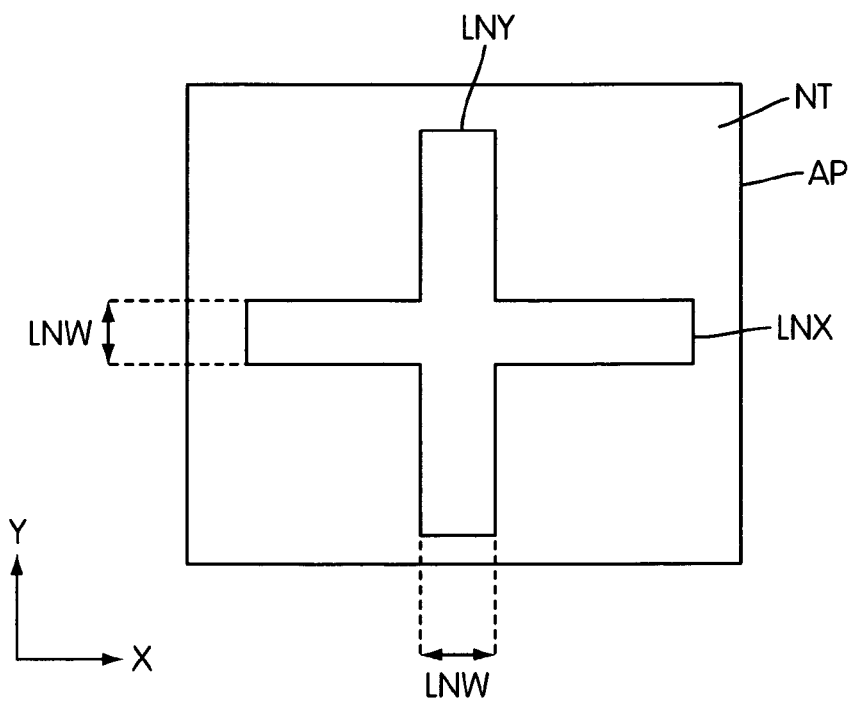
FIG. 3 depicts an analyzer plate.

A view of the analyzer plate AP in the x-y plane of FIG. 1 is shown in FIG. 3. The analyzer plate AP contains two crossing lines LNX, LNY in different directions. The line LNY in the y-direction may have the same dimensions as the line LNX in the x-direction but is rotated by substantially 90 degrees (i.e. is in a perpendicular direction). The lines LNX, LNY of the analyzer plate are transparent for the projected beam of radiation whereas an area NT around the lines LNX, LNY of the analyzer plate AP is not transparent (i.e. is opaque) for the projected beam of radiation. Non-transparency can be provided, for example, using material which is reflective or absorptive to the projection beam radiation.

For the purposes of describing embodiments of the invention, polarization of the incident projected beam of radiation will be defined as follows. X-polarized radiation is radiation which has its electric vector in the x-direction and its magnetic vector in the y-direction. Y-polarized radiation is radiation which has its electric vector in the y-direction and its magnetic vector in the x-direction.

The widths LNW of the lines LNX, LNY on the analyzer plate AP in FIG. 3 are chosen to be smaller than the wavelength λ of the beam of radiation. Because of this, line LNX will let through (transmit) radiation which is y-polarised, and line LNY will let through (transmit) radiation which is x-polarised. The widths of lines LNX and LNY are equal, so that the polarisation selectivity of the lines is equal. The lengths of the lines are also equal, with the effect that the lines LNX, LNY let through an equal amount of radiation.

References in the above paragraph to letting through radiation (or transmission) of radiation are intended to mean letting through (or transmission) of a propagating non-evanescent mode of radiation. Radiation which is not let through (or is not transmitted) as a propagating mode may be let through (or transmitted) as evanescent waves. The term evanescent wave refers to an electromagnetic field produced in the vicinity of the lines, which extends outwardly along a lowermost surface of the analyzer plate AP (i.e. the surface that faces the radiation sensor DS). The electromagnetic fields do not propagate like normal electromagnetic waves. Instead, the energy of the evanescent radiation is transferred to heat on the analyzer plate AP. Evanescent waves do not propagate normally. Provided that the radiation sensor DS is placed at a remote position from the surface of the analyzer plate AP, the radiation sensor will therefore not detect the evanescent waves and will only detect propagating non-evanescent radiation. This is the reason for providing the vacuum in the space SP between the analyzer plate AP and the radiation sensor DS (FIG. 2). If a dielectric medium were to be present between the analyzer plate and the detector instead of the vacuum, some fraction of the evanescent light might be converted to propagating waves, introducing error into the measured radiation. It may be possible to have a dielectric medium present instead of the vacuum, provided that the dielectric constant is sufficiently low so that the evanescent waves are not able to propagate to the radiation sensor DS.

The width LNW of lines LNX, LNY on the analyzer plate AP is related to the wavelength λ of the radiation, in that it is equal to or smaller than the wavelength λ. For a typical wavelength of 248 nm, the typical line width LNW may be between about 60 and 150 nm. For a typical wavelength of 193 nm, the typical line width LNW may be between about 50 and 100 nm. For a typical wavelength of 157 nm, the typical line width LNW may be between about 50 and 120 nm. For a typical wavelength of 13 nm, the typical line width LNW may be between about 3 and 13 nm.

Figure 4:
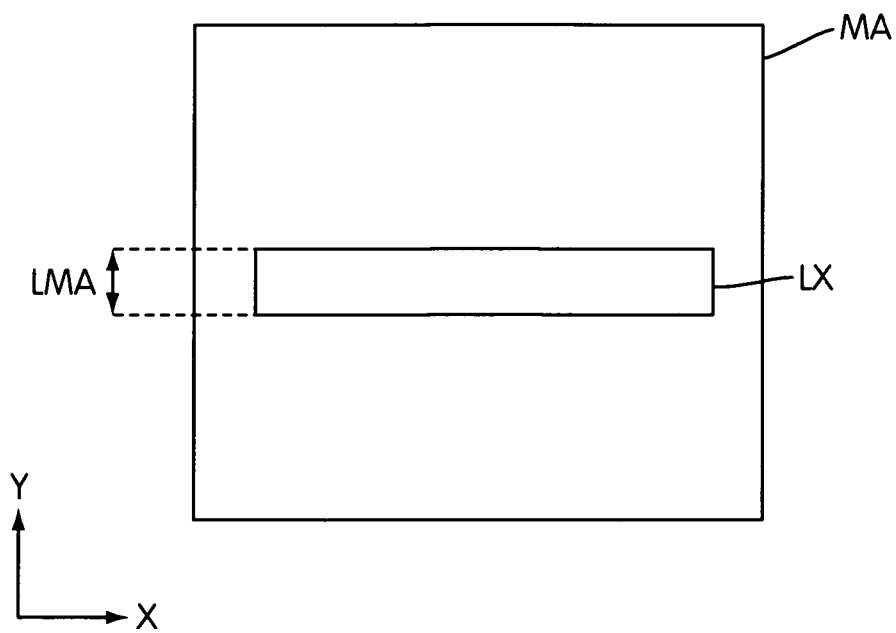
FIG. 4 depicts a patterning device.
Figure 5:
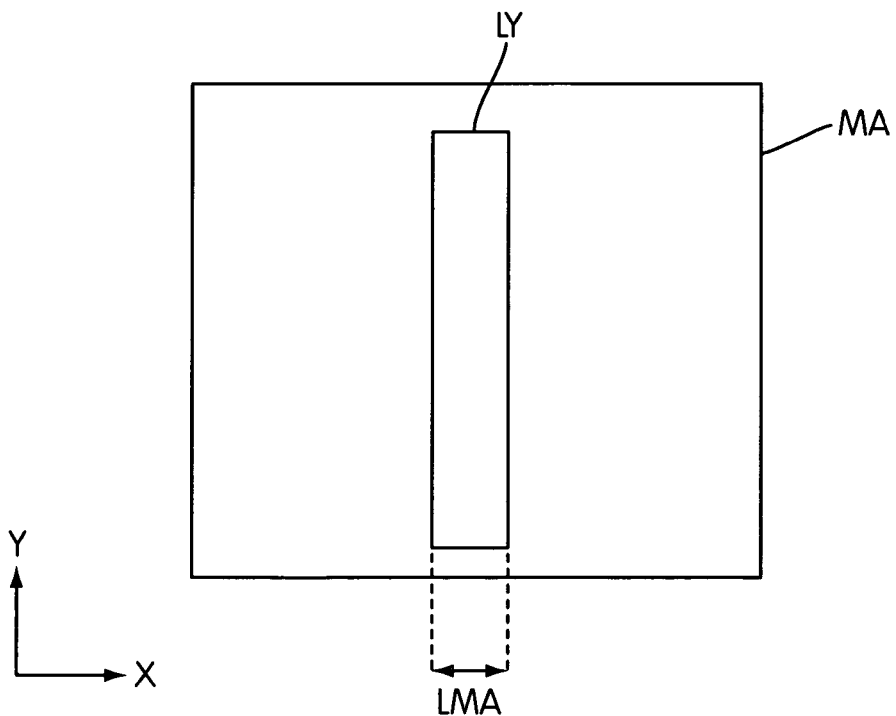
FIG. 5 depicts a patterning device.

The analyzer plate AP is illuminated by illumination radiation that has traversed the patterning device of the lithographic apparatus (MA in FIG. 1). The patterning device MA contains either a line LX in the x-direction as shown in FIG. 4 or a line LY in the y-direction as shown in FIG. 5, or both (not shown in FIGS. 4 or 5), as long as they do not cross. The line LY in the y-direction has the same dimensions as the line LX in the x-direction but is rotated by about 90 degrees. Both lines LX, LY are transparent for illumination radiation, and the area surrounding the lines is opaque for illumination radiation. The line width LMA of the lines on the patterning device MA is substantially equal to the line width LNW of the lines on the analyzer plate AP divided by a size reduction (MAG) and multiplied by an engineering factor (EF).

$$LMA=(LNW/MAG)*EF$$

Figure 6:
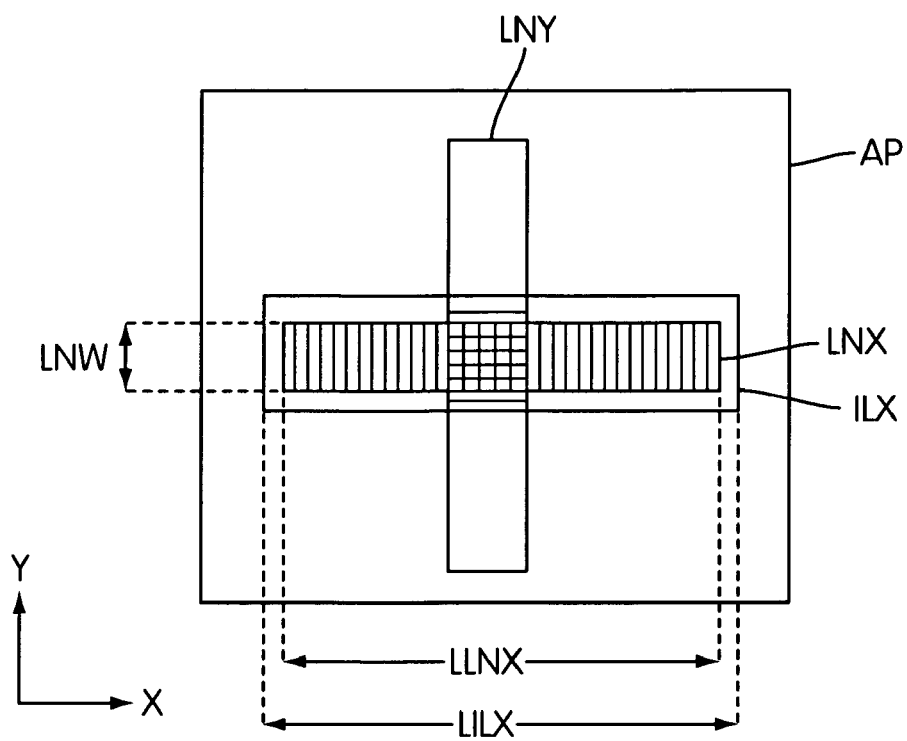
FIG. 6 depicts an analyzer plate in use.

The size reduction MAG is a conventional parameter, and is calculated by dividing the size of a feature in the image of a patterning device MA on the analyzer plate AP by the size of the feature on the patterning device MA. The size reduction MAG is a property of the projection system PL of the lithographic apparatus. The engineering factor EF controls the dimensions of the line of the projection beam as imaged onto the analyzer plate AP as shown in FIG. 6. FIG. 6 shows the image ELX of the line LX of FIG. 4 formed on the analyzer plate AP (the patterning device MA and the analyzer plate AP are in optimized positions relative to each other and the projection system PL).

It can be seen that the image ILX on the analyzer plate AP is wider than the line LNX of the analyzer plate. This is to ensure that the line LNX is always fully illuminated, even if small positioning errors in the y-direction have occurred. This extra width of the image ELX and therefore of the line LNX is determined by the engineering factor EF. Typically the engineering factor is chosen so that the line LX has an image ILX on the analyzer plate that is twice as wide as the line LNX of the analyzer plate. A limitation of the engineering factor EF is, that it should be chosen so that the lines on the patterning device MA are sufficiently wide that the percentage of radiation that is let through is equal for radiation polarized in any direction. For this, the lines on the patterning device MA have to be much wider than the wavelength λ of the projected beam radiation.

In one example, for projection beam with a wavelength of 193 nm, the line width LNW of the lines on the analyzer plate may be about 75 nm. For an engineering factor EF of 2, this would give a line width LMA of the line LX on the patterning device MA of about 600 nm. These values are given as examples wherein the size reduction MAG, which is a machine property, is ¼. It will be appreciated that other suitable values may be used (for example MAG might be 1 or ⅕).

The length of the image ILX is LILX, whereas the length of the line LNX is LLNX. The length LILX of the image ILX is either longer (shown in FIG. 6) or smaller (not shown) than the length LLNX of the line LNX to ensure that when small positioning errors in the x-direction have occurred, these errors will not influence the amount of radiation projected onto the line LNX.

An example of the analyzer plate in use is shown in FIG. 6. The analyzer plate AP is illuminated by passing the projected beam of radiation through the x-oriented line LX on the patterning device (not shown in FIG. 6), to form an image ELX. The projected beam PB of radiation passes through the lines LNX, LNY to the radiation sensor (not visible in FIG. 6). Since the radiation sensor is a polarization insensitive detector, it does not distinguish between radiation which passes through the line LNX and radiation which passes through the line LNY. Instead, the radiation sensor gives a single output value which depends upon the total energy of radiation incident on the radiation sensor. Since the patterning device is not polarization selective, both x- and y-polarised radiation is incident upon the analyzer plate AP. In FIG. 6, the area that lets through y-polarized radiation is indicated by cross-hatching in the y-direction, and the area that lets through x-polarised radiation is indicated by cross-hatching in the x-direction. The entire area of line LNX of the analyzer plate AP lets through the y-polarised radiation. In contrast, a small proportion of the entire area of the line LNY of the analyzer plate AP lets through x-polarised radiation. This means that the amount of y-polarised radiation incident on the radiation sensor is much greater than the amount of x-polarised radiation incident on the radiation sensor (in this example around 4 times greater). This gives the radiation sensor polarisation sensitivity, when used together with the analyzer plate AP and the patterning device. The radiation sensor therefore provides an energy measurement which is predominantly comprised of y-polarised radiation. In other words, the patterning device with the line LX is arranged to give a measurement by the radiation sensor DS a preference for radiation polarised in the y-direction, via the pattern in the cross section of the beam of radiation projected onto the analyzer plate AP.

Although in the above example, the radiation reaches the radiation sensor DS directly after passing the projection system and the analyzer plate AP, in practice, the radiation can be reflected, for example, by a mirror into the x-direction (FIG. 1) before reaching the radiation sensor DS. Other configurations with changes of direction of the radiation may also be possible, for example with the radiation sensor DS being positioned at some distance from the analyzer plate AP. It will be appreciated that the radiation has to pass the projection system PL first and then analyzer plate AP before it reaches the radiation sensor DS and that this order will be understood by describing the analyzer plate being between the projection system PL and the radiation sensor DS.

It will be appreciated that increasing the width of the image ILX may reduce the polarization sensitivity of the combination of the radiation sensor and analyzer plate AP. This is because x-polarized radiation will be incident on a larger proportion of the line LNY, so that more x-polarized radiation will be let through the analyzer plate AP to the radiation sensor. This reduces the polarization sensitivity. In other words, a change in the pattern in the cross section of the radiation, changes the preference of the measurement for radiation polarized in the y-direction. For this reason, it is important that the engineering factor EF is not too large.

To obtain an energy measurement which is predominantly of x-polarized radiation, the analyzer plate AP is illuminated in the same manner as shown in FIG. 6, but using the y-orientated line LY of the patterning device MA (FIG. 5).

The amount of polarized radiation measured by the radiation sensor is compared for the line in the x-direction and the line in the y-direction, to determine a ratio of polarized radiation in the projection beam after it has been transmitted through the projection system. If the ratio of polarized radiation energy is not 1 (i.e. the energy of one polarization is greater than that of the other polarization), this may indicate that lenses of the projection system perform differently for different polarization directions. This may indicate imperfections in the lenses.

Measurements of the ratio of polarized radiation in the projection beam PB can be repeated, for example, after exposure of each wafer, to track differences of the polarization of the projected beam PB. These differences can indicate shifts or degradations of lenses of the projection system PL.

The measurement of the ratio of polarized radiation in the projected beam PB of radiation may be repeated with the patterning device MA and the analyzer plate AP always being located in the same positions. In this way, each time the same positions in the cross section of the projection beam PB and the projection system PL are used. The result of the measurement could be assumed to be the same across the projected beam of radiation and projection system. Alternatively, the patterning device MA and the analyzer plate AP may be moved between measurements, to obtain polarized radiation measurements for different positions in the cross section of the projected beam PB of radiation and the projection system PL. Alternatively, the patterning device MA may contain several sets of lines LX and LY. In this alternative embodiment, only the analyzer plate AP is moved between measurements, to obtain polarized radiation measurements for different positions in the cross section of the projection beam PB and the projection system PL.

Other cross sections of the projection system may be analyzed by measuring with different settings of the illumination system IL, such as a dipole setting or a quadrupole setting. Using these different settings, different positions in the cross section of projection system PL are used to project the beam of radiation onto the analyzer plate AP.

The above description in relation to FIGS. 4, 5 and 6 refers to two transparent lines LNX, LNY being provided in the analyzer plate AP. In general, the analyzer plate includes a transparent substrate which is provided with a layer of non-transparent material (not shown). The layer of non-transparent material may preferably be provided on the lowermost surface (i.e. the surface facing the radiation sensor DS) of the substrate, but may be provided on the top surface (i.e. the surface facing the projection system PL) of the substrate. To achieve contrast, the layer of non-transparent material may include a layer of metal, for example Chromium and or Aluminum, with an optical density of around 7. An optical density of 7 means that the amount of radiation passing compared to the amount of radiation incident on the layer of non-transparent material is reduced by a factor of $10^{-7}$. To achieve this, a Chromium layer may have a thickness of around 0.1 μm and an Aluminum layer would have a thickness of around 0.08 μm.

The transparent lines, i.e. the lines that let through radiation, are provided in the layer of non-transparent material.

During lithographic projection, the face of a substrate facing the projection system is brought into the image plane of the object imaged by the projection system. This allows a focused pattern to be correctly imaged onto the substrate. When using the invention, the layer of non-transparent material of the analyzer plate AP may be positioned in the image plane of the pattern on the patterning device MA imaged by the projection system. The measurements obtained give information on the polarization that would be found on a wafer, if it were irradiated during the normal lithographic projection by the pattern on the patterning device MA in the same relative position to the projection system.

The above description is for a particular example of the use of the invention. However, it will be appreciated for a person skilled in the art that other uses of the invention are possible. It should be appreciated that the lines in the analyzer plate AP can be chosen in directions other than the x- and y-direction of FIG. 3. However, the lines in the patterning device MA may be most advantageously chosen in the same directions as the lines in analyzer plate. AP so as to optimize for the difference in measured polarizations. It should be realized by a man skilled in the art that the lines in the analyzer plate AP will be most advantageously chosen to be straight and substantially orthogonal to one another, so as to avoid needing computation to split up the contributions of radiation polarized in the orthogonal directions. Finally, it should be appreciated by the person skilled in the art, that the lines in the analyzer plate AP may be most advantageously chosen to be substantially straight orthogonal lines, preferentially letting through radiation polarized in the directions of circuit features. With this choice, it is easiest to predict the result of the projection of radiation onto a substrate W (FIG. 1) during production. In practice, many features of the circuit are in the x-direction or the y-direction.

As described above, the amount of radiation measured by the radiation sensor DS depends on several parameters, such as the amount of radiation coming from the illumination system, the area of the lines LX, LY on the patterning device MA, the transmission of the projection system PL and the size of the areas LNX, LNY letting through radiation on the analyzer plate. The separate parameters of which the amount of radiation measured by the radiation sensor DS depends, will be discussed below.

Figure 7:
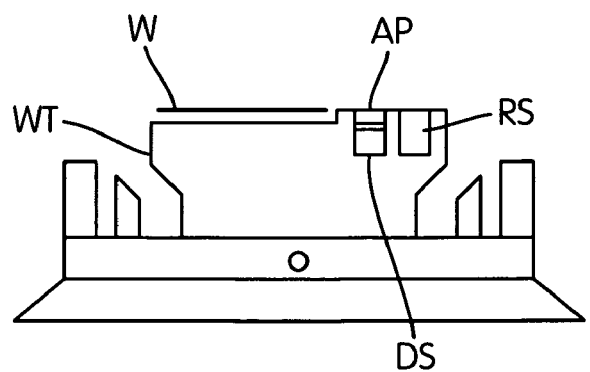
FIG. 7 depicts a position of a radiation sensor.

The amount of energy of radiation coming from the illumination system is commonly referred to as dose. The dose in different pulses of laser radiation varies. Using different pulses with different doses for consecutive measurements of radiation with different polarization directions will contribute to errors in the ratio of the measurement values. To correct for dose variations in the measurements another sensor, reference sensor RS, shown in FIG. 7, is used. Referring to FIG. 7 the reference sensor RS is contained in the substrate table WT adjacent to the radiation sensor DS.

Figure 8:
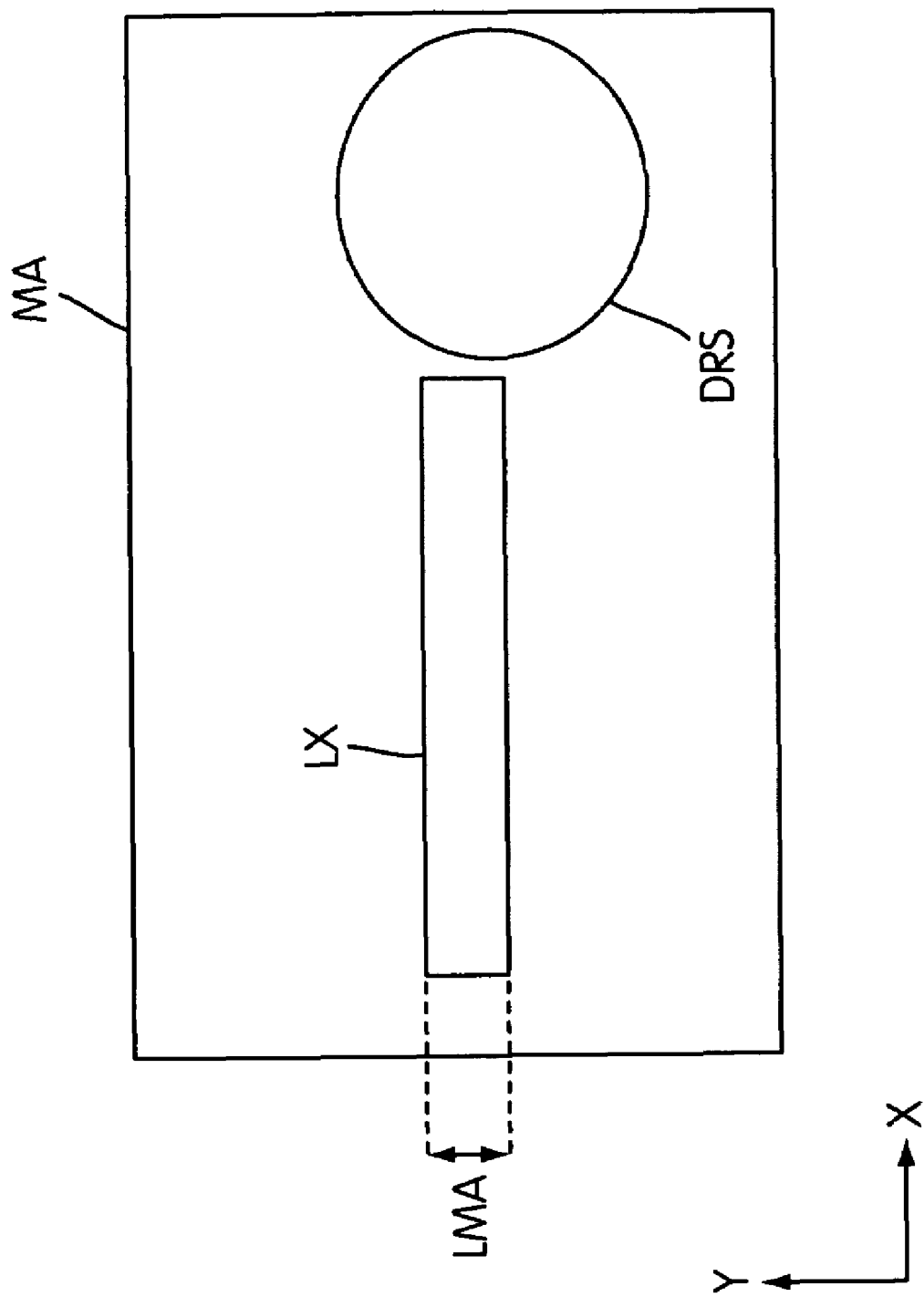
FIG. 8 depicts a diaphragm on a patterning device.

The reference sensor RS is used together with a dedicated patterning device MA, shown in FIG. 8. The patterning device MA contains an aperture DRS located adjacent to the line LX. A typical diameter of the aperture DRS is about 4.8 mm for a wavelength of the projected beam of radiation of 193 nm. The reference sensor RS is polarization insensitive. For other wavelengths, the apertures may be different, depending on the doses in shots of the laser source of the projected beam of radiation and the sensitivity of the reference sensor. In use (not shown), the projection system forms an image of the line LX over the line in the x-direction on the analyzer plate (not shown). Simultaneously, the projection system forms an image of the aperture DRS on the reference sensor RS (not shown).

The reference sensor RS provides a reference dose measurement for each polarization measurement made using the invention. The dose variations are corrected for, by normalizing the polarization measurement by radiation sensor DS using the reference dose measurement. The reference dose measurement is used by dividing the reference dose measurement by a normalization constant, giving a calibration parameter. The polarization measurement is normalized by dividing the polarization measurement through the calibration parameter.

It will be appreciated that other configurations may be used to provide a reference measurement.

The line LX on the patterning device MA may contain production deviations. When a line LX and a line LY on the patterning device are used to measure the amount of radiation polarized in different directions and to compare the results, the deviations to the designed lines contribute to errors in the comparison. By removing the analyzer plate AP and performing a measurement with the projected beam patterned by line LX, radiation sensor DS measures the amount of radiation let through the line LX, independent of polarization direction. By repeating the measurement with LY instead of LX, the relative size of those lines can be determined. In both measurements the variations in size of the lines LNX, LNY on the analyzer plate are excluded.

The lines LNX and LNY on analyzer plate AP may contain production deviations. When the measurements for radiation with different polarization directions are compared, these deviations may lead to errors in the comparison. The errors can be avoided by measuring the areas of the lines LNX, LNY. This is done by measuring the amount of radiation let through each line LNX, LNY, and comparing them to give a comparison between the areas of the lines LNX and LNY. To avoid polarization dependency influencing the measured radiation let through the lines LNX, LNY, the radiation let through the lines LNX, LNY when illuminated with x-polarized radiation and when illuminated with y-polarized radiation is measured. Polarization of the radiation provided by the illumination system can be achieved, for example, by inserting a polarizer into the beam PB of radiation (see FIG. 1). The polarizer may be located between the illumination system IL and the support structure MT, between the support structure MT and the projection system PL, or between the projection system PL and the analyzer plate AP. Also the illumination system IL may contain a polarizer. It will be appreciated that a radiation source SO that only radiates polarized radiation could be used.

It will be appreciated that the analyzer plate may be rotated for measuring the amount of radiation polarized in a direction other than the x-direction and the y-direction. Alternatively, rotating the analyzer plate can be used to calibrate the measurements. Calibration may be needed because of differences in the areas of the lines LNX, LNY on the analyzer plate. Calibrations may also be needed because of differences in the combination of the line LX on the patterning device and the line LNX on the analyzer plate letting through radiation compared to the combination of the line LY on the patterning device and the line LNY on the analyzer plate letting through radiation. To correct for these differences a first measurement with radiation let through the line LX and the line LNX is done with the image of the line LX being positioned to give a maximal, first measurement value. The analyzer plate AP is rotated by about 90 degrees, moved so that the image of line LY falls over line LNX and then the position is optimized to give a maximal amount of radiation let through the line LY and the line LNX. A second measurement is taken. The difference between the first measurement and the second measurement indicates a difference between the lines LX and LY. The analyzer plate AP is moved and optimized to give a third measurement for radiation let through the line LX and the line LNY. The difference between the first measurement and the second measurement indicates the difference between the lines LNX and LNY.

In an advantageous use of the invention, changes to the transmittance of an astigmatic Projection System PL (FIG. 1) are measured. With an astigmatic Projection System PL the images of the lines LX (FIG. 4) and LY (FIG. 5) on the patterning device MA are in focus at different z-positions. A first measurement is taken using radiation let through the line LX and the analyzer plate line LNX. A second measurement is taken using the radiation let through the line LY and the analyzer plate line LNY without correcting the z-position of substrate table WT (FIG. 1). At least one of the two measurements will have a too low value, so that the measurement cannot be used as an absolute measurement of polarization direction. This problem is solved without measuring the astigmatism itself, by normalizing both measurements using the reference sensor RS and calculating a ratio of both normalized measurements. Changes over time in this ratio indicate that there is a change in the transmittance of the projection system PL for radiation with different polarization directions. The first ratio is used as a reference ratio. Further ratios, calculated from measurements taken at a later point in time, are compared to the reference ratio to indicate the changes in the ratio.

In practice, absolute polarization information is commonly preferred over relative polarization information. The relative measurements obtained as described above can be used to give absolute polarization information after a calibration with an absolute polarization measurement. In order to calibrate the relative measurements, an absolute polarization detector is arranged beneath the projection system PL (i.e. in the position where during production the substrate would be positioned). The absolute polarization detector provides an absolute measurement of polarization. The absolute polarization measurement is stored. The absolute polarization detector is removed from its measuring position. Then the radiation sensor DS and analyzer plate AP are brought at the position where during production the substrate would be positioned. A relative measurement of polarization is performed by the radiation sensor DS. A calibration parameter is determined from the stored measurement of the absolute polarization detector and the relative measurement of radiation sensor DS. The calibration parameter is stored. Further relative measurements of the radiation sensor DS done, for example, between the exposure of two successive substrates, can be converted into absolute polarization information by using the previously stored calibration parameter. The radiation sensor DS may be recalibrated after a period of time, when the deviation from the polarization of the latest calibration measurements reaches a certain threshold or when a certain dose of radiation has passed the projection system PL (FIG. 1). It should be realized that the decision to recalibrate may be taken on other information.

Figure 9:
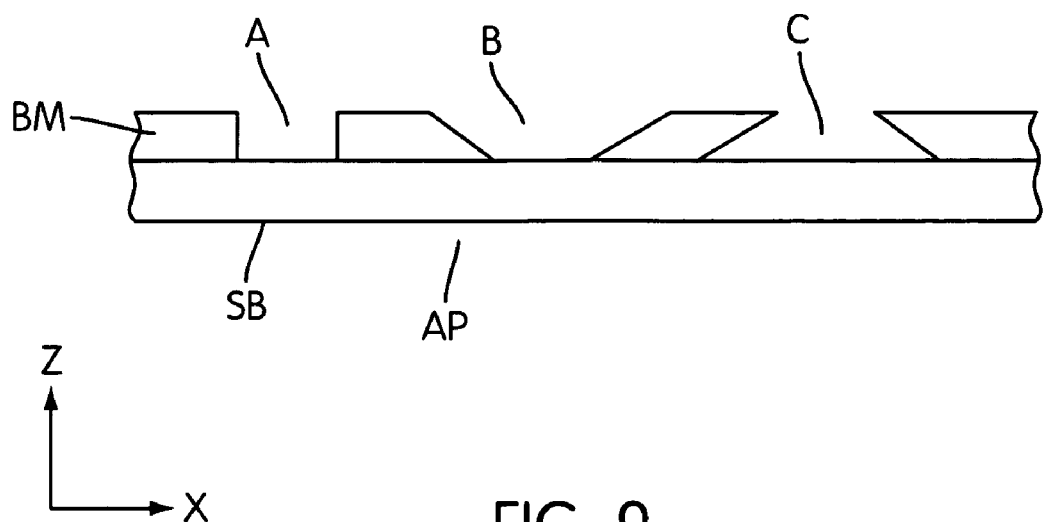
FIG. 9 depicts cross sections of the transparent areas on an analyzer plate.

Radiation with different polarization directions may be measured without changing the pattern on the patterning device or the area on the analyzer plate AP used for the measurements. Changing the numerical aperture NA between two measurements modifies the amount of radiation per polarization direction let through the lines LNX, LNY on the analyzer plate AP and therefore changes the measurement. This can be explained using lines provided in the layer of non-transparent material on the analyzer plate AP with several different cross-sectional geometries. FIG. 9 shows an analyzer plate with cross-sectional views of several such lines in the layer BM of non-transparent material. The analyzer plate further includes a carrier SB, to carry the layer BM of non-transparent material. Line A has vertical walls, whereas line B has a v-shaped geometry and line C has an inverted v-shaped geometry. Experiments have shown that lines with v-shaped or inverted v-shaped geometry let through more radiation than lines with vertical walls. It is believed that thin, non-transparent materials are able to transmit some of the radiation when the thickness is below a certain threshold. Because of this transmission through the thin, non-transparent material, the effective widths of the lines B and C are larger than the width of the line A. Furthermore, it is believed that there may be a collection horn effect for line B, with the v-shaped geometry allowing a better impedance match between free space and the interior of the line.

Radiation irradiating a line A of FIG. 9 with a high numerical aperture may be transmitted through the edge of the layer of non-transparent material the same way as it is transmitted through the thin parts of the non-transparent material as described above. Changing the numerical aperture NA between two measurements therefore modifies the radiation per polarization direction let through the lines A,B,C and therefore changes the measurement. In other words calibrations for the measurements using the lines LX (FIG. 4) and LY (FIG. 5) of the patterning device MA and calibrations for the measurements using the crossing lines LNX and LNY (FIG. 6) of the analyzer plate AP can be avoided. The radiation polarized in the y-direction is measured for a first numerical aperture using line LX and line LNX. The radiation polarized in x-direction is measured for a second numerical aperture using line LX and line LNX. Both measurements are compared to earlier measurements to indicate changes over time.

It will be appreciated by a person skilled in the art, that tunneling slits may be used instead of transparent lines in the layer BM of non-transparent material. A tunneling slit includes an optically transparent ridge-like structure covered by a thin, planar metal film. Instead of having a transparent line in the planar metal film, it has a very thin layer of metal over the highest part of the ridge so that the radiation can tunnel through the very thin layer of metal. Examples of such slits are given in U.S. Pat. No. 5,631,731, which is hereby incorporated.

Figure 10:
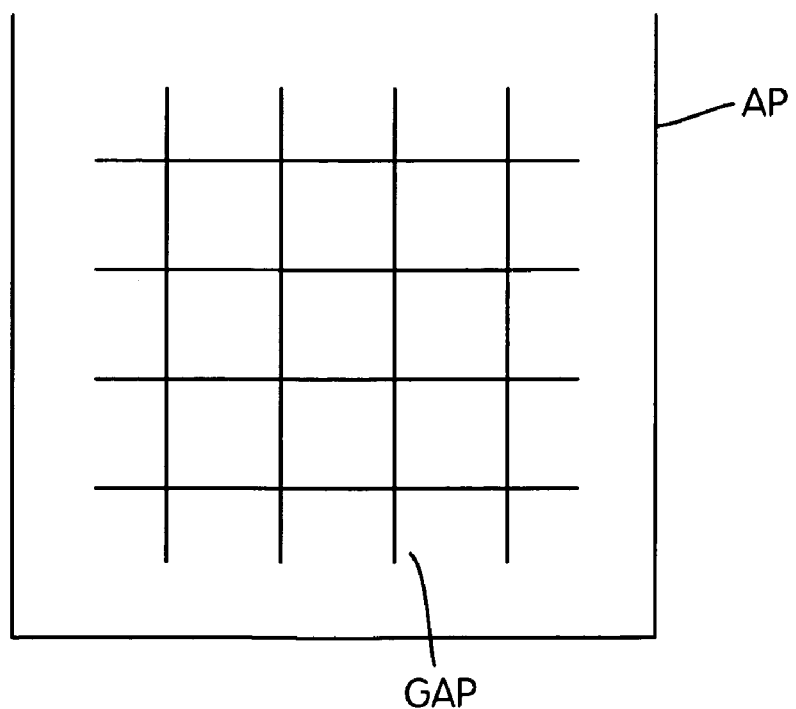
FIG. 10 depicts an analyzer plate with multiple transparent parallel areas in both directions.

In an embodiment of the invention, the analyzer plate AP contains a large number of parallel lines in either x-direction or y-direction or both. In order to increase the signal to noise ratio, several of those lines are irradiated during one measurement. Another advantage of such use is that production tolerances in the area of each separate line are less significant compared with the total measurement. A suitable analyzer plate is shown in FIG. 10. Referring to FIG. 10, the analyzer plate includes a grating GAP having parallel, orthogonal lines with a pitch of about 3 μm and a line width of about 100 nm. This is suitable for a projected beam of radiation having a wavelength of 248 nm. It should be appreciated that other pitches and line widths should be used for other projection beam wavelengths.

Figure 11:
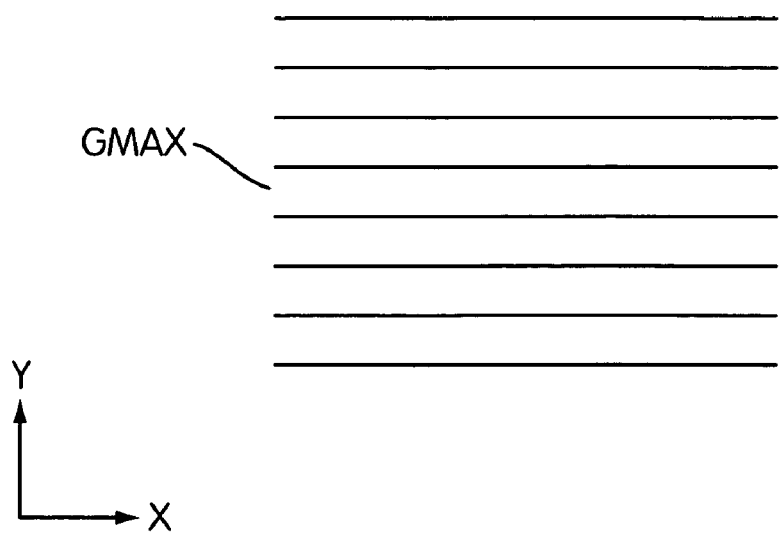
FIG. 11 depicts a patterning device with multiple transparent parallel areas in x-direction.

FIG. 11 shows a patterning device with a grating GMAX suitable for use in connection with the analyzer plate having a grating GAP. The grating GMAX includes a large number of parallel lines which extend in the x-direction. A typical pitch for the grating GMAX would be about 12 μm, and a typical line width would be about 1200 nm (for a projected beam of radiation having a wavelength of 248 nm). Typically the pitch for grating GMAX and the line width for grating GMAX would be chosen so that the pitch is about 10 times the line width of the lines of the grating GAP, or more.

Figure 12:
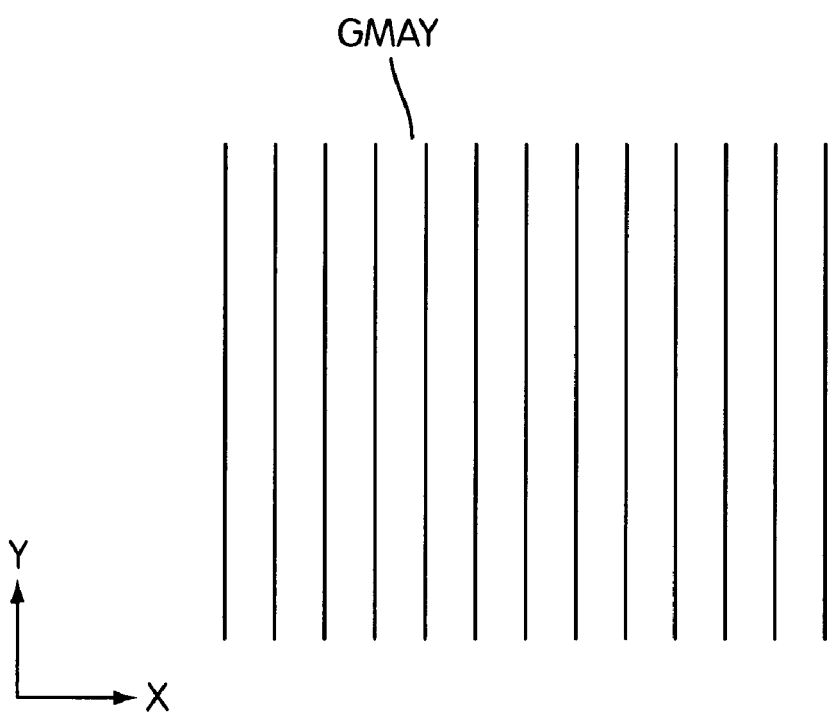
FIG. 12 depicts a patterning device with multiple transparent parallel areas in y-direction.

FIG. 12 shows a second patterning device with a grating GMAY, suitable for use in connection with the analyzer plate having the grating GAP (FIG. 10). This grating GMAY includes a large number of parallel lines which extend in the y-direction. The pitch and line width of the lines of the grating GMAY correspond to those for grating GMAX (FIG. 11).

In use, the patterning device containing grating GMAX is introduced into the beam PB (FIG. 1), and the analyzer plate AP is aligned with the image of the grating GMAX of the patterning device. The amount of radiation let through the analyzer plate is measured using the radiation sensor DS. The patterning device containing grating GMAX is replaced with the patterning device containing grating GMAY. The analyzer plate is then aligned with the image of the grating GMAY and the amount of radiation let through the analyzer plate is measured using the radiation sensor DS. The measurement taken while using grating GMAY, is compared to the measurement taken while using grating GMAX, to give a relative polarization. Since the patterning device contains a large number of parallel lines in the gratings GMAX, GMAY and illuminates a large number of corresponding lines on the analyzer plate AP, this increases the amount of radiation let through the analyzer plate AP, thereby increasing the signal to noise ratio of the measurements.

It should be appreciated that a single patterning device may be provided with the gratings GMAX, GMAY located adjacent to one another. This avoids the requirement to swap the patterning device, thereby increasing the speed of the measurement and having little impact on the production of the lithographic apparatus in numbers of substrates per hour. Changing the patterning device costs valuable production time.

The polarization measurements can be taken with even less impact on the production of the lithographic apparatus in numbers of substrates per hour. To achieve this, the gratings GMAX, GMAY may be provided in a small area of a patterning device, the remainder of which bears a product pattern. Using such a patterning device, the polarization measurements can be taken without changing the patterning device. In an advantageous use of the invention, the lithographic apparatus performs in-line measurements with the radiation sensor. The patterning device is provided with a circuit pattern as well as the grating GMAX. The image of the circuit pattern is projected onto the substrate W (FIG. 1) simultaneously with the image of the grating GMAX being projected onto the analyzer plate AP. An in-line measurement is performed by radiation sensor DS simultaneously with the illumination of a circuit pattern on a target area C on a substrate W. Alternatively, a measurement with radiation sensor DS and analyzer plate AP is performed while bringing the substrate table WT to the projection system PL.

An advantage of the in-line measurements is that the performance of the projection system may be analyzed without lowering the hourly production of the lithographic apparatus.

Figure 13:
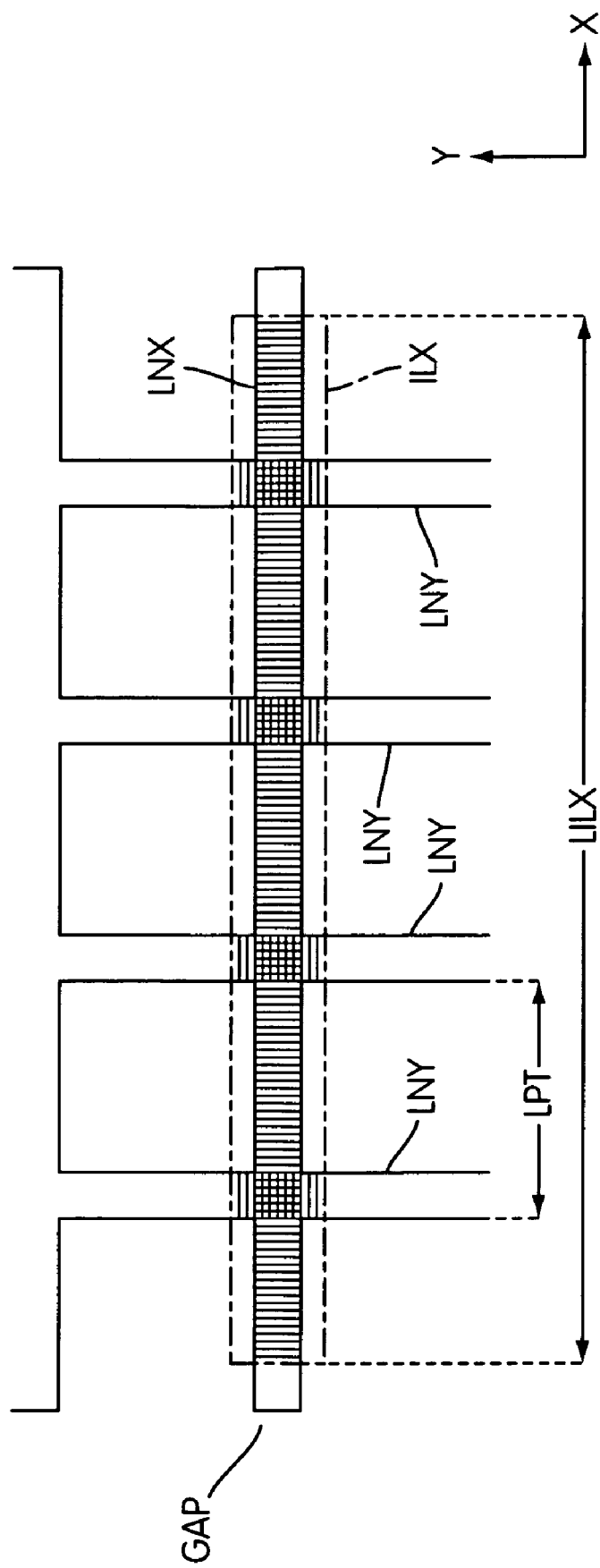
FIG. 13 depicts a line in a given direction and parts of several lines in another direction being illuminated.

As in the earlier use of the invention with single lines, the engineering factor for the gratings GMAX, GMAY on the patterning device, is chosen so that the lines on the patterning device MA are sufficiently wide to have radiation passing without a preference for a polarization direction. Furthermore the engineering factor determines the dimensions of the line of the patterning device MA as imaged onto the substrate as shown in FIG. 13. The choice for the engineering factor of the lines in grating GMAX will now also depend on the pitch of grating GMAX. The first reason for this is shown in FIG. 13, which shows the image ILX of a line LX on grating GMAX on patterning device MA projected onto a part of the grating GAP on analyzer plate AP. The width LMA of the line LX will be chosen small enough, so that radiation polarized in the y-direction is let through the analyzer plate AP to a larger extent than radiation polarized in the x-direction. To achieve this, the illuminated area of a line LNX oriented in the x-direction on grating GAP is larger than the illuminated areas of the lines LNY oriented in the y-direction. In FIG. 13, the illuminated area of the x-direction line LNX is indicated by cross hatching in the y-direction. The illuminated areas of the y-direction lines, is indicated by cross hatching in the x-direction. The condition for LMA is expressed as $$LILX > LMA * MAG * NRY$$

where NRY indicates the number of illuminated y direction lines LNY. In FIG. 13, there are 4 such lines and their illuminated areas are shaded with lines in x-direction. When the length LILX (FIG. 6) of image ILX meets this condition the length of the illuminated x-direction line is larger than the length of the sum of the illuminated y-direction lines. Here the width of the x-direction line LNX is equal to the width of the y-direction lines.

When the number NRY of lines with their long sides along the y-axis is large, this number can be approximated by $$NRY \approx (LILX/LPT),$$

wherein LPT is the pitch between the y-direction lines on the analyzer plate AP. Filling in the approximation in the condition for LMA and using the fact that the condition for LMA does not contain negative numbers, the condition for LMA reduces to $$LMA < LPT/MAG.$$

Fulfilling this condition means that radiation polarized in the y-direction is let through the analyzer plate AP to a larger extent than radiation polarized in the x-direction.

The total area covered by the grating GAP (FIG. 10) is in the order of magnitude of 200 $\mu m^2$ for $\lambda=193$ nm and in the order of magnitude of 1200 $\mu m^2$ for $\lambda=157$ nm. The total area determines the total area letting through radiation and is designed to provide sufficient signal to noise ratio in the radiation sensor DS (FIG. 1).

It should be appreciated that the regions letting through radiation on analyzer plate AP do not have to be lines, but could be regions without a particular shape, as long as there is a difference in letting through radiation polarized in different directions. In a preferred embodiment, the directions of polarized radiation preferentially let through the two areas are perpendicular. In practice, this has the advantage that computations, to split up the contributions of radiation polarized into perpendicular directions, are avoided. These computations are performed because polarization expressed in perpendicular directions is easiest to interpret. It may give, for example, direct indication of TE- and TM-polarized radiation to passing the patterning device MA when illuminating a target area C (FIG. 1) with a circuit pattern.

Figure 14:
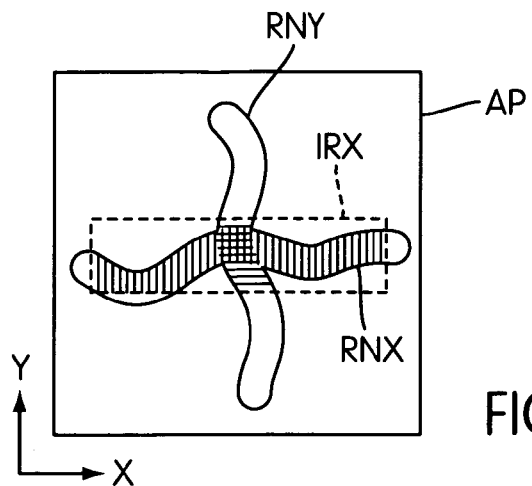
FIG. 14 depicts a transparent area on an analyzer plate which is not a line.

Examples of regions without a particular shape are shown in FIG. 14. The top surface (i.e. the surface facing a projection system) of analyzer plate AP is illuminated by an image IRX of a region RX (not shown). The image IRX is shown to be shorter than the region RNX, so that small variations in the relative positions in x-direction of the image IRX and the region RNX do not result in variations in the measurements.

The region RNX and the region RNY are both partially illuminated, indicated by shading lines. The region RNX preferentially lets through radiation polarized in the y-direction because the main direction of the region is in x-direction. The region RNY preferentially lets through radiation polarized in the x-direction because the main direction of the region is in y-direction. The illuminated area that preferentially lets through radiation polarized in the y-direction is larger than the illuminated area that preferentially lets through radiation polarized in the x-direction. Therefore a measurement with a radiation sensor positioned facing the lowermost surface of the analyzer plate (i.e. the surface facing the radiation sensor) will preferentially measure radiation polarized in the y-direction.

Figure 15:
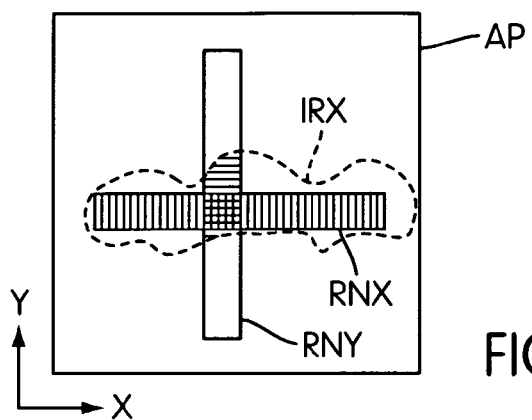
FIG. 15 depicts the image of a transparent line area on an analyzer plate illuminated by a pattern which is not a line.

It should be appreciated that the transparent region on the patterning device MA does not have to be a line, as long as the illuminated area of the region RNX is larger than the illuminated area of the region RNY. This is shown in FIG. 15. FIG. 15 shows the top surface (i.e. the surface facing a projection system) of an analyzer plate AP having a transparent region RNX that preferentially lets through radiation polarized in the y-direction and a transparent region RNY that preferentially lets through radiation polarized in the x-direction. The analyzer plate AP is illuminated by an image IRX. The illuminated area of the region RNX is larger than the illuminated area of the region RNY. Therefore a measurement with a radiation sensor positioned facing the lowermost surface of the analyzer plate (i.e. the surface away from the projection system) will preferentially measure radiation polarized in the y-direction.

Figure 16:
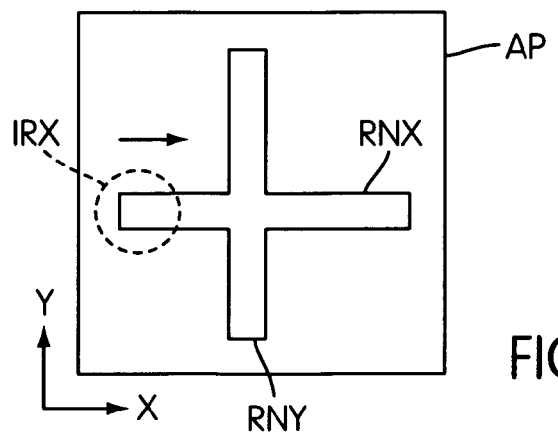
FIG. 16 depicts the image of a transparent area on a patterning device irradiating only a part of a transparent area on an analyzer plate.

It should be realized that the selectivity can be increased by avoiding illuminating the crossing parts of the transparent regions. This is shown in FIG. 16, which shows the analyzer plate AP having a region RNX which preferentially lets through radiation polarized in the y-direction and a region RNY crossing the region RNX and preferentially letting through radiation polarized in the x-direction. The region RNX is partially illuminated by an image IRX. A radiation sensor measuring the radiation let through the analyzer plate AP during illumination by the image IRX, will preferentially measure radiation polarized in the y-direction.

It will be appreciated, that the image IRX can be scanned over region RNX. During the scan, image IRX is moved along region RNX on analyzer plate AP and measurements are performed on the radiation let through the analyzer plate AP, with a radiation sensor (not shown). The direction in which the image IRX is scanned over the analyzer plate is indicated by an arrow in FIG. 16. When during the scan, the image IX starts to partially overlap the region RNY, the measurements are less preferential to radiation polarized in y-direction. In other words, the polarization selectivity of the measurements change. In order to maintain high polarization selectivity for the measurements, there is an option not to irradiate patterning device MA (not shown) at the point where the image RX would also cover the region RXY. Alternatively, the change in selectivity could be used to measure the ratio between radiation polarized in x-direction and in y-direction. It will be appreciated that the image IRX can be used to scan over the region RNY as well. Finally, it will be realized that the patterning device MA can have a pattern with an image IRX that closely matches the crossing regions RNX,RNY. Measuring radiation preferentially polarized in the y-direction can be achieved by positioning the image IRX and the analyzer plate AP such that a larger area of the region RNX is illuminated than the region RNY.

In the event that a maskless lithographic apparatus is used, the apparatus is still able to provide radiation patterned in a non-polarizing way, patterned appropriately for the analyzer plate AP. This means that the discrimination between radiation with different polarization directions can be done at analyzer plate AP for the maskless lithographic apparatus.

It will be appreciated that the images of regions on the patterning device MA should fall onto the desired regions on analyzer plate AP and some capturing may be involved to get the intended relative x and y position of the analyzer plate AP and the patterning device. Conventional capturing means may be used for this purpose.

It should be appreciated by a person skilled in the art that some leakage of the non-transparent layer of material on the analyzer plate may be acceptable. Therefore a wide variety of optical densities and thicknesses of the layer of non-transparent material can be chosen. This is because the analyzer plate may be applied to measure the changes in the ratio of radiation polarized in one direction relative to radiation polarized in another direction. With an unchanged leakage of the transparent layer of material on the analyzer plate, changes in the ratio can still be measured. However, when both radiation polarized in the x-direction and polarized in the y-direction may leak through the non-transparent layer of material, the polarization selectivity of the sensor decreases.

In an embodiment of the invention, the measurements by radiation sensor DS are used as a basis to adjust the lithographic apparatus. For example, adjustments may be made to the polarization state of the projection beam of radiation PB (FIG. 1) so that the polarization state of the image formed onto a target area C on substrate W changes. This may be achieved by changing settings in the illumination system IL or other optical elements in the lithographic apparatus. Also, adjustment may be made to the settings of the projection system PL (FIG. 1). Examples of changes to settings of the illumination system IL are directed to change the numerical aperture NA or to change the intensity distribution in the cross-section of the beam PB. The adjustments can be made to optimize either the system such as the projection system PL, or can be made to optimize the overall performance of the combination of the projected beam of radiation PB, the projection system PL and the illumination system IL. This will increase the lifetime of the projection system PL, because the lithographic apparatus can be kept within its specifications even if the projection system degrades. When the projection system itself is outside its specifications, this may be corrected for by adjustments in other parts of the lithographic apparatus. The projection system only needs to be replaced if the overall performance of the lithographic apparatus is outside its specification.

It will be appreciated, that the invention can be used to measure radiation polarized in one of 3 or more directions. To measure radiation polarized in one of 3 directions, in addition to the region LNX and the region LNY, the analyzer plate may have an additional region letting through radiation polarized in a direction at a 45 degree angle to the x-direction and the y-direction. For example, the analyzer plate may have 4 lines, all crossing each other to be able to measure radiation polarized in one of four directions. The lines have an angle of 45 degrees to their nearest neighboring lines. A first line preferentially lets through radiation polarized in x-direction. A second line preferentially lets through radiation polarized in a first direction with a substantially 45 degree angle around the z-axis (FIG. 1) to the x-direction. A third line preferentially lets through radiation polarized in the y-direction. A forth line preferentially lets through radiation polarized in a second direction with a substantially 45 degree angle around the z-axis (FIG. 1) to the x-direction. All lines cross at the same point. Arranged in this way, the first and the third lines preferentially let through radiation polarized in perpendicular directions. Also, the second and the forth line preferentially let through radiation polarized in perpendicular directions. The patterning device has transparent lines that can be applied to preferentially illuminate any of the four lines present on the analyzer plate. It will be appreciated that other configurations wherein the analyzer plate contains lines with different orientations and the patterning device includes corresponding lines are possible as well. It will be appreciated that the transparent regions do not have to be transparent lines, but could be regions without a particular shape, as long as there is a difference in letting through radiation polarized in different directions.

It will be appreciated that an expected difference in the amount of radiation polarized in the x-direction and polarized in the y-direction before the radiation reaches the analyzer plate may be compensated for. In an example more radiation polarized in x-direction is expected than polarized in y-direction. If more radiation is measured by the radiation sensor polarized in x-direction than polarized in y-direction, the signal to noise ratio for a measurement on radiation polarized in x-direction is better than the signal to noise ratio for a measurement on radiation polarized in y-direction. Compensation can either be achieved by increasing the length or width of the region RNX relative to the width or length of the region RNY. Alternatively, the radiation sensor (DS) is arranged to preferentially measure radiation polarized in the y-direction out of un-polarized radiation (i.e. radiation with an equal amount of radiation polarized in the x-direction as radiation polarized in the y-direction) falling onto the radiation sensor. The preference of the polarization sensor compensates for the lower amount of radiation polarized in y-direction falling onto the radiation sensor.

It would be appreciated by those of ordinary skill in the art that the present invention could be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. A lithographic apparatus comprising:
   a projection system configured to project a patterned beam of radiation onto a target portion of a substrate;
   an analyzer plate including a first region arranged to transmit radiation polarized in a first direction, and a second region arranged to transmit radiation polarized in a second direction, and
   a radiation sensor configured to sequentially measure radiation transmitted by the first region and the second region of the analyzer plate, wherein the second region crosses the first region.

2. The lithographic apparatus of claim 1, further comprising a patterning device support configured to hold a patterning device, the patterning device configured to pattern a beam of radiation to form the patterned beam of radiation.

3. The lithographic apparatus of claim 2, wherein the patterning device comprises a region arranged to transmit the beam of radiation, the transmission of the beam of radiation through the patterning device being independent of a polarization direction of the beam of radiation.

4. The lithographic apparatus of claim 1, wherein the first direction and the second direction are substantially perpendicular.

5. The lithographic apparatus of claim 1, wherein the first region and the second region on the analyzer plate include substantially perpendicular lines.

6. The lithographic apparatus of claim 1, wherein the analyzer plate includes a third region arranged to transmit radiation polarized in the first direction and to form a grating in combination with the first region.

7. The lithographic apparatus of claim 6, wherein the analyzer plate includes a fourth region arranged to transmit radiation polarized in the second direction and to form a grating in combination with the second region, and wherein the third region and the fourth region cross each other.

8. The lithographic apparatus of claim 2, wherein the patterning device is configured to pattern the beam of radiation with a circuit pattern and with a pattern arranged to select the area of the first region and the area of the second region.

9. The lithographic apparatus of claim 8, wherein the lithographic apparatus is configured to perform in-line measurements with the radiation sensor.

10. The lithographic apparatus of claim 1, further comprising a reference sensor configured to calibrate the measurement by the radiation sensor.

11. The lithographic apparatus of claim 1, wherein the radiation sensor is configured to measure unpolarized radiation transmitted by the projection system, so as to measure radiation polarized in the first direction.

12. The lithographic apparatus of claim 1, wherein the radiation sensor includes a photocell.

13. An analyzer plate comprising:
   a first region arranged to transmit radiation polarized in a first direction, a second region arranged to transmit radiation polarized in a second direction,
   a third region arranged to transmit radiation polarized in the first direction and to form a grating in combination with the first region, and a fourth region arranged to transmit radiation polarized in the second direction and to form a grating in combination with the second region,
   wherein the first and the second regions cross each other, and the third region and the fourth region cross each other.

14. The analyzer plate of claim 13, wherein the first region and the second region include substantially perpendicular lines.

15. The analyzer plate of claim 13, wherein the analyzer plate is arranged to be used in a lithographic apparatus to measure a polarization of radiation projected by a projection system of the lithographic apparatus.

16. A subassembly configured to receive radiation, the subassembly comprising:
   an analyzer plate including a first region arranged to transmit radiation polarized in a first direction and a second region arranged to transmit radiation polarized in a second direction, and
   a radiation sensor positioned on the opposite side of said analyzer plate relative to the source of said radiation, and arranged to receive the radiation passing through the analyzer plate, wherein the second region crosses the first region.

17. The subassembly of claim 16, wherein the first region and the second region include substantially perpendicular lines.

18. The subassembly of claim 16, wherein the analyzer plate includes a third region arranged to transmit radiation polarized in the first direction and to form a grating in combination with the first region; and a fourth region arranged to transmit radiation polarized in the second direction and to form a grating in combination with the second region, wherein the third region and the fourth region cross each other.

19. The subassembly of claim 16, wherein said subassembly is arranged to be used in a lithographic apparatus to measure a polarization of radiation projected by a projection system of the lithographic apparatus.

20. A method of measuring a parameter of a projection system, wherein the parameter differs in value with a change of polarization state of a beam of radiation that propagates through the projection system, the method comprising:

patterning a cross section of the beam of radiation, wherein the patterning does not substantially influence the polarization state of the beam of radiation;

projecting the patterned beam of radiation onto an analyzer plate, the analyzer plate including a first region arranged to transmit radiation polarized in a first direction, and a second region arranged to transmit radiation polarized in a second direction, the second region crossing the first region, said patterned beam of radiation being substantially projected onto the first region of the analyzer plate, and measuring an amount of radiation passing through the analyzer plate using a radiation sensor to give a measurement value that includes radiation polarized in the first direction.

21. The method of claim 20, wherein said parameter is transmittance for a polarization direction.

22. The method of claim 20, further comprising measuring a different amount of radiation passing through the analyzer plate, and comparing the measurement value that includes radiation polarized in the first direction with a measurement value of the different amount of radiation to indicate the polarization state of the projection beam of radiation projected onto the analyzer plate.

23. The method of claim 22, wherein the measurement of the different amount of radiation is obtained when the patterned beam of radiation is substantially projected onto the first region of the analyzer plate.

24. The method of claim 22, wherein the measurement of the different amount of radiation is obtained when the patterned beam of radiation is substantially projected onto the second region of the analyzer plate.

25. The method of claim 22, further comprising adjusting parameters of the projection system based upon the comparison of the amount of radiation.

26. The method of claim 20, further comprising adjusting illumination conditions of an illumination system arranged to condition the beam of radiation.

27. The method of claim 26, wherein the illumination conditions of the illumination system are adjusted based on the comparison of said amount of radiation.

28. The method of claim 26, further comprising adjusting the illumination conditions of the illumination system to measure a performance of different cross sections of the projection system using the analyzer plate and the radiation sensor.

29. The method of claim 22, further comprising changing the polarization state of the projected beam of radiation based upon the comparison.

30. The method of claim 20, further comprising rotating the analyzer plate around an optical axis of the projection system to measure radiation polarized in a given direction.

31. A method of measuring a polarization state of a beam of radiation in a lithographic apparatus, the method comprising:

selecting an area of one of a first and a second region of an analyzer plate to be exposed by the beam of radiation, said first region being arranged to transmit radiation polarized in a first direction and said second region being arranged to transmit radiation polarized in a second direction, wherein said first and second regions cross each other;

substantially projecting the beam of radiation onto the area of said one region of the analyzer plate, and measuring an amount of radiation transmitted through the area of said one region, and substantially projecting the beam of radiation onto the other one of said first and second regions of the analyzer plate, and measuring an amount of radiation transmitted through the area of said other one region.

* * * * *

UNITED STATES PATENT AND TRADEMARK OFFICE
CERTIFICATE OF CORRECTION

PATENT NO. : 7,619,747 B2 Page 1 of 1
APPLICATION NO. : 11/014236
DATED : November 17, 2009
INVENTOR(S) : Sengers et al.

It is certified that error appears in the above-identified patent and that said Letters Patent is hereby corrected as shown below:

On title page, item (56) References Cited
replace "2005/1020687"
with --2005/0206879 A1--.

Signed and Sealed this

Nineteenth Day of January, 2010

David J. Kappos
*Director of the United States Patent and Trademark Office*